United States Patent
Cho et al.

(10) Patent No.: US 7,917,776 B2
(45) Date of Patent: Mar. 29, 2011

(54) SYSTEM-ON-CHIP INCLUDING DEEPSTOP MODE TO REDUCE TOTAL LEAKAGE CURRENT AND METHOD THEREOF

(75) Inventors: Sung-Hoon Cho, Yongin-si (KR); Jae-Young Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 853 days.

(21) Appl. No.: 11/896,348

(22) Filed: Aug. 31, 2007

(65) Prior Publication Data

US 2008/0054956 A1 Mar. 6, 2008

(30) Foreign Application Priority Data

Sep. 1, 2006 (KR) .................. 10-2006-0084278

(51) Int. Cl.
*G06F 1/26* (2006.01)
(52) U.S. Cl. .................. 713/300; 713/320; 713/323
(58) Field of Classification Search .................. 713/300, 713/320, 323; 327/142
See application file for complete search history.

(56) References Cited

U.S. PATENT DOCUMENTS

| | | | | |
|---|---|---|---|---|
| 6,140,836 A * | 10/2000 | Fujii et al. | ....................... | 326/35 |
| 6,320,418 B1 * | 11/2001 | Fujii et al. | ....................... | 326/93 |
| 6,433,584 B1 * | 8/2002 | Hatae | .............................. | 326/80 |
| 6,501,300 B2 * | 12/2002 | Hatae | .............................. | 326/93 |
| 7,010,706 B2 * | 3/2006 | Clark et al. | ................... | 713/320 |
| 7,332,949 B2 * | 2/2008 | Kim | ............................. | 327/202 |

FOREIGN PATENT DOCUMENTS

| | | |
|---|---|---|
| JP | 2000-101418 | 4/2000 |
| KR | 10-2005-0052644 | 6/2005 |
| KR | 10-0564634 | 3/2006 |

* cited by examiner

*Primary Examiner* — Nitin C Patel
(74) *Attorney, Agent, or Firm* — Harness, Dickey & Pierce, P.L.C.

(57) ABSTRACT

A system-on-chip may include a hard-macro block, a deep-stop control logic circuit, and/or a multi-threshold complementary metal-oxide-semiconductor (MTCMOS) logic circuit. The deepstop control logic circuit may be configured to transfer data to the hard-macro block from the multi-threshold complementary metal-oxide-semiconductor (MTCMOS) logic circuit during a normal mode. The deepstop control logic circuit may be configured to latch the data output from the MTCMOS logic circuit upon an entry into a deepstop mode and interrupt a power supply to the hard-macro block during the deepstop mode.

15 Claims, 6 Drawing Sheets

SYSTEM-ON-CHIP INCLUDING DEEPSTOP MODE TO REDUCE TOTAL LEAKAGE CURRENT AND METHOD THEREOF

PRIORITY STATEMENT

This U.S. non-provisional patent application claims the benefit of priority under 35 U.S.C. §119 to Korean Patent Application No. 2006-84278 filed on Sep. 1, 2006, the entire contents of which are incorporated herein in their entirety by reference.

BACKGROUND

1. Field

Example embodiments relate to system-on-chips (SOCs). For example, example embodiments relate to an SOC including a deepstop mode to reduce the total leakage current by conducting a power-off mode to a hard-macro block (e.g., core and intellectual property) incapable of using multi-threshold complementary metal-oxide-semiconductor (MTCMOS).

2. Description of Related Art

A conventional SOC includes an MTCMOS logic circuit having multiple threshold voltages, an MTCMOS control logic circuit for controlling the MTCMOS logic circuit, a real time clock circuit, and a hard-macro block (e.g., a core (CPU) or non-MTCMOS logic circuit).

The MTCMOS control logic circuit generates control signals for controlling the MTCMOS logic circuit in response to signals provided from a power manager and a time clock circuit, and provides the control signals to the MTCMOS logic circuit.

If a conventional SOC is operating in a stop mode, the MTCMOS logic circuit holds a data state of an input terminal in a condition just before entering the stop mode in response to the control signals generated from the MTCMOS control logic circuit and turns off N/PMOS transistors including N/PMOS transistors with higher threshold voltages per each cell, thereby reducing a leakage current. Therefore, a conventional SOC design scheme reduces a leakage current of the MTCMOS logic circuit, thereby decreasing the total power consumption.

If a conventional SOC switches to a normal mode from the stop mode, the MTCMOS logic circuit operates in the normal mode. In the normal mode, the MTCMOS logic circuit transfers data, which has been reserved in the stop mode, to blocks (e.g., the real time clock circuit, a hard-macro block, etc.). Namely, the MTCMOS logic circuit transfers input data to each block in the normal mode.

However, because the hard-macro block of a conventional SOC is fixedly constructed in a desired, or alternatively a predetermined hardware pattern through a fabrication process thereof, it is impossible to modify the circuit structure of the hard-macro block. Accordingly, the hard-macro block is harder to implement in the MTCMOS logic circuit, and a leakage current flows without limitation in the condition of supplying power to the hard-macro block. Therefore, if a conventional SOC is operating in the stop mode, the conventional SOC is unable to reduce a leakage current of the hard-macro block.

SUMMARY

Example embodiments may provide an SOC and/or method capable of using a deepstop mode to reduce the total leakage current by turning a hard-macro block off.

According to an example embodiment, a system-on-chip may include a hard macro block, a deepstop control logic circuit, and/or a multi-threshold complementary metal-oxide-semiconductor (MTCMOS) logic circuit. The deepstop control logic circuit may be configured to transfer data to the hard-macro block from the MTCMOS logic circuit during a normal mode. The deepstop control logic circuit may be configured to latch the data output from the MTCMOS logic circuit upon an entry into a deepstop mode and/or interrupt a power supply to the hard-macro block during the deepstop mode.

According to an example embodiment, the system-on-chip may include a power manager and/or a multi-threshold complementary metal-oxide-semiconductor (MTCMOS) control logic circuit. The power manager may be configured to activate a deepstop enabling signal, during the deepstop mode, and a deepstop-mode condition signal indicating the entry into the deepstop mode. The MTCMOS control logic circuit may be configured to activate a power managing signal and a data control signal in response to an activation of the deepstop-mode condition signal. The deepstop control logic circuit may be configured to latch the data output from the MTCMOS logic circuit in response to activations of the deepstop enabling signal, the deepstop-mode condition signal, and the data control signal, and/or to interrupt the power supply to the hard-macro block in response to activations of the deepstop enabling signal and the power managing signal.

According to an example embodiment, the data control signal may be activated after the activation of the deepstop-mode condition signal, and/or the power managing signal may be activated after the activation of the data control signal.

According to an example embodiment, the deepstop control logic circuit may include a first signal generator, a second signal generator, a first switch, and/or a floating protection circuit. The first signal generator may be configured to activate a core enabling signal in response to activations of the deepstop enabling signal and the power managing signal. The second signal generator may be configured to activate a data transmission control signal in response to activations of the deepstop-mode condition signal and the deepstop enabling signal. The first switch may be configured to selectively output the data from the MTCMOS logic circuit in response to the data transmission control signal. The floating protection circuit may be configured to transfer the data to the hard-macro block from the first switch, and/or to latch the output data of the first switch and to interrupt an electrical connection to the first switch during the activation of the data control signal.

According to an example embodiment, after interrupting the electrical connection to the first switch, the data latched by the floating protection circuit may be conditioned in a logically low state.

According to an example embodiment, the hard-macro block may include a core logic circuit and/or a second switch. The second switch may be configured to interrupt the power supply to the core logic circuit in response to an activation of the core enabling signal.

According to an example embodiment, the MTCMOS logic circuit may be configured to generate a reset signal during the normal mode, and/or the deepstop control logic circuit may be configured to selectively generate a deepstop reset signal in response to the deepstop enabling signal and the deepstop-mode condition signal, and/or generate a core reset signal in response to the reset signal and the deepstop reset signal.

According to an example embodiment, the MTCMOS control logic circuit may be configured to generate a delayed deepstop-mode condition signal in response to an activation of the deepstop-mode condition signal.

According to an example embodiment, the system-on-chip may include a real time clock circuit configured to operate in response to the delayed deepstop-mode condition signal and/or generate a wakeup signal in accordance with an entry into the normal mode.

According to an example embodiment, if the wakeup signal is activated, the MTCMOS control logic circuit may be configured to inactivate the power managing signal and the data control signal, generate a delayed wakeup signal, and/or output the delayed wakeup signal to the power manager, and/or the power manager may be configured to inactivate the deepstop enabling signal and the deepstop-mode condition signal in response to the delayed wakeup signal.

According to an example embodiment, the first signal generator may be configured to inactivate the core enabling signal if the power managing signal and the deepstop enabling signal are inactivated so that that the power supply to the hard-macro block may be resumed.

According to an example embodiment, the second signal generator may be configured to inactivate a data transmission control signal in response to inactivations of the deepstop-mode condition signal and the deepstop enabling signal, and/or the first switch may be configured to transfer the data to the floating protection circuit from the MTCMOS logic circuit during inactivation of the data transmission control signal.

According to an example embodiment, the floating protection circuit may be electrically connected to the first switch if the data control signal is inactivated.

According to an example embodiment, a method for controlling power of a system-on-chip may include latching data transferred to a hard-macro block from a multi-threshold complementary metal-oxide-semiconductor (MTCMOS) logic circuit during a deepstop mode. A power supply to the hard-macro block may be interrupted after latching the data. The power supply to the hard-macro block may be resumed if the deepstop mode switches to a normal mode, and/or data transmission to the hard-macro block from the MTCMOS logic circuit may be resumed.

According to an example embodiment, the method may include interrupting an electrical connection between the hard-macro block and the MTCMOS circuit while latching the data transferred to the hard-macro block from the MTCMOS logic circuit.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
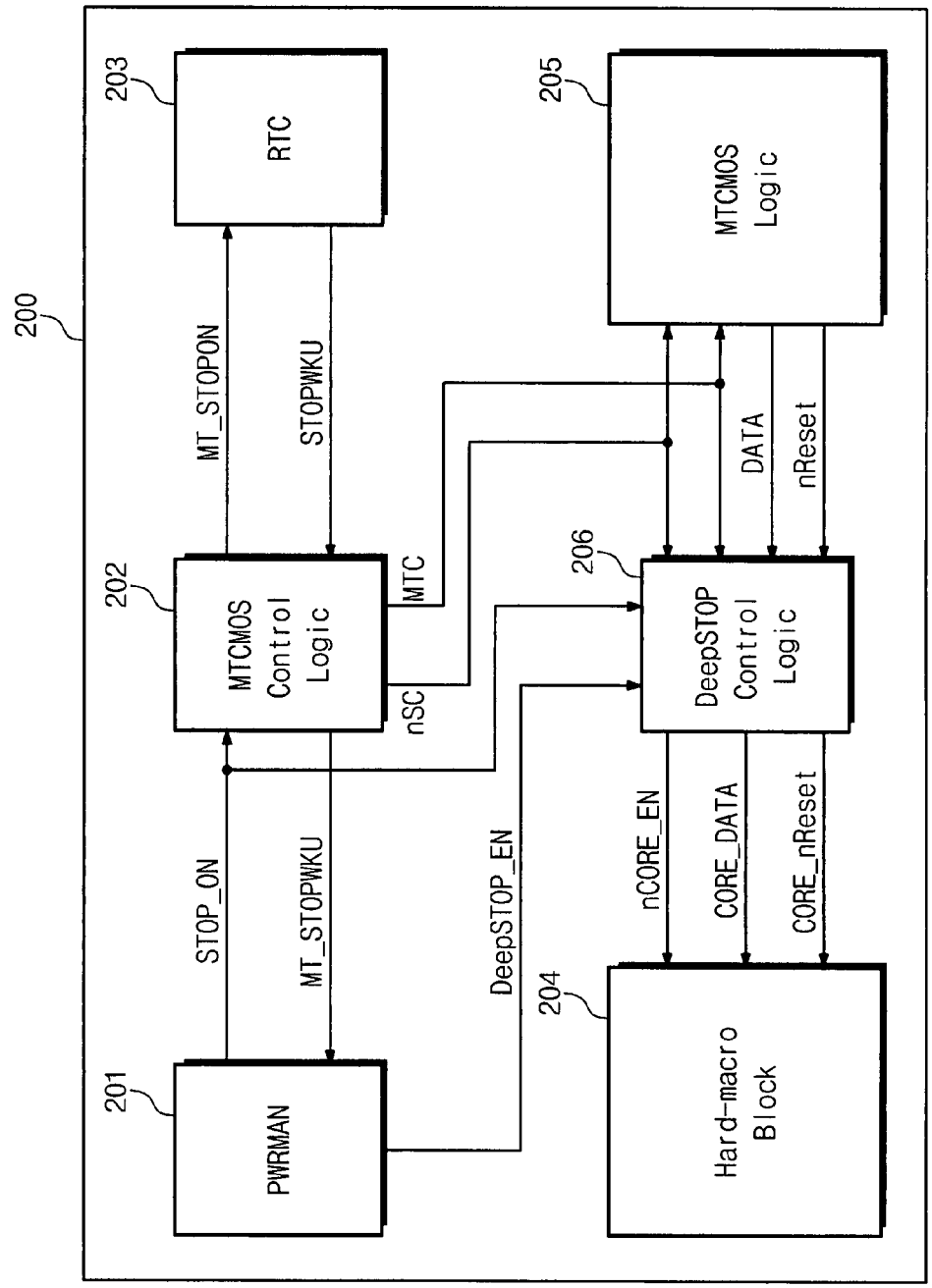
FIG. 1 is a block diagram including a deepstop control logic circuit according to an example embodiment.

Example embodiments will now be described more fully hereinafter with reference to the accompanying drawings. Embodiments may, however, be in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a block diagram including a deepstop control logic circuit according to an example embodiment.

Referring to FIG. 1, an SOC 200 according to an example embodiment may include of a power manager 201, an MTCMOS control logic circuit 202, a real time clock circuit 203, an MTCMOS logic circuit 205, a deepstop control logic circuit 206, and/or a hard-macro block 204. The MTCMOS control logic circuit 202 may operate to control the MTCMOS logic circuit 205. The MTCMOS logic circuit 205, which may operate as a flipflop, may transfer input data to each block if the SOC 200 is operating in a normal mode and/or latch data if the SOC 200 is operating in a stop mode. The deepstop control logic circuit 206 may enable a deepstop mode.

The power manager 201 may generate a stop-on signal STOP_ON, which indicates the SOC is in the stop mode, if the SOC 200 switches to the stop mode from the normal mode and/or transfer the stop-on signal STOP_ON to the MTCMOS control logic circuit 202.

The power manager 201 may generate the stop-on signal STOP_ON and/or a deepstop enabling signal DeepSTOP_EN for controlling the deepstop control logic 206 if the SOC 200 switches to the deepstop mode from the normal mode. The stop-on signal STOP_ON generated by the power manager 201 may be provided to the MTCMOS control logic circuit 202 and the deepstop control logic circuit 206, and/or the deepstop enabling signal DeepSTOP_EN may be provided to the deepstop control logic circuit 206. The power manager 201 may first output the deepstop enabling signal DeepSTOP_EN and next output the stop-on signal STOP_ON.

The real time clock circuit 203 may read information, for checking the normal mode (e.g., set time information), from a memory block (not shown) by way of the MTCMOS logic circuit 205. If the SOC 200 switches to the stop mode or the deep stop mode from the normal mode, the real time clock circuit 203 may check that the SOC 200 is periodically switching back to the normal mode after the stop mode or the deepstop mode, or after a desired, or alternatively, a predetermined set time in response to a multi-stop-on signal MT_STOPON generated by the MTCMOS control logic circuit 202 as a delayed signal of the stop-on signal STOP_ON. If the SOC 200 returns to the normal mode, the real time clock circuit 203 may generate a wakeup signal STOPWKU to the MTCMOS control logic circuit 202.

The MTCMOS control logic circuit 202 may receive the stop-on signal STOP_ON from the power manager 201 and/or the wakeup signal STOPWKU from the real time clock circuit 203. The MTCMOS control logic circuit 202 may generate control signals nSC and MTC for controlling the MTCMOS logic circuit 205, the multi-stop-on signal MT_STOPON delayed from the stop-on signal STOP_ON, and/or a multi-wakeup signal MT_STOPWKU delayed from the wakeup signal STOPWKU.

The control signals nSC and MTC, the multi-stop-on signal MT_STOPON, and the multi-wakeup signal MT_STOPWKU, generated from the MTCMOS control logic circuit 202, may be output having delay times different from each other. If the SOC 200 switches to the stop mode or the deepstop mode from the normal mode, the control signal nSC may be output later than the control signal MTC, and/or the multi-stop-on signal MT_STOPON may be output later than the control signal nSC. If the SOC 200 switches to the normal mode from the stop mode or the deepstop mode, the control signal MTC may be output later than the control signal nSC, and/or the multi-wakeup signal MT_STOPWKU may be output later than the control signal MTC.

The control signals nSC and MTC generated from the MTCMOS control logic circuit 202 are output to the MTCOMS logic circuit 205 and the deepstop control logic circuit 206. The stop-on signal MT_STOPON is output to the real time clock circuit 203 and the multi-wakeup signal MT_STOPWKU is output to the power manager 201.

The MTCMOS logic circuit 205 may latch data, which is to be transferred to each of the blocks, in a state just before the stop mode or the deepstop mode in response to the control signal MTC generated from the MTCMOS control logic circuit 202 if the SOC 200 switches to the stop mode or the deepstop mode from the normal mode.

For example, in reading data or address information from a memory block by each block (e.g., the hard-macro block 204 or the real time clock circuit 203) if the SOC 200 is operating in the normal mode, the data or address information may be read through the MTCMOS logic circuit 205 operating as a flipflop. For example, data of the memory block may be transferred to each block by way of the MTCMOS logic circuit 205. If the SOC 200 switches to the stop mode or the deepstop mode from the normal mode, the MTCMOS logic circuit 205 functioning as a flipflop may latch data, which is to be transferred to each block, in a state just before the stop mode or the deepstop mode. Each cell of the MTCMOS logic circuit 205 may include N/PMOS transistors having higher threshold voltages. Accordingly, the leakage current of the MTCMOS logic circuit 205 may be reduced by turning the N/PMOS transistors having the higher threshold voltages off in response to the control signal nSC generated from the MTCMOS control logic circuit 202.

If the SOC 200 switches to the stop mode or the deepstop mode from the normal mode, the control signal MTC generated from the MTCMOS control logic circuit 202 may be output earlier than the control signal nSC. Accordingly, if the SOC 200 is operating in the stop mode or the deep stop mode, the MTCMOS logic circuit 205 may first latch data in response to the control signal MTC, thereby reducing a leakage current by through the use of the control signal nSC.

The deepstop control logic circuit 206 may receive the stop-on signal STOP_ON and the deepstop enabling signal DeepSTOP_EN generated from the power manager 201, and/or receive the control signals nSC and MTC generated from the MTCMOS control logic circuit 202. The deepstop control logic circuit 206 may generate a core enabling signal nCORE_EN in response to the control signals DeepSTOP_EN and nSC, and/or control an on or off-state of the power supplied to the hard-macro block 204 in response to the core enabling signal nCORE_EN. During the normal mode of the SOC 200, the hard-macro block 204 may be supplied with power by the core enabling signal nCORE_EN. During the deepstop mode of the SOC 200, the power supplied into the hard-macro block 204 by the core enabling signal nCORE_EN may be interrupted.

The deepstop control logic circuit 206 may transfer data DATA, which is input from the MTCMOS logic circuit 205 for transmission to the hard-macro block 204, to a floating protection circuit (e.g., refer to 2061 in FIG. 5) if the SOC 200 is operating in the normal mode. If the SOC 200 is operating in the deepstop mode, the deepstop control logic circuit 206 may convert data DATA, which is input from the MTCMOS logic circuit 205, to a low level and transfer the low level data to the floating protection circuit.

The floating protection circuit (e.g., refer to 2061 in FIG. 5) of the deepstop control logic circuit 206 may transfer the input data DATA to the hard-macro block 204 as core data CORE_DATA in response to the control signal MTC if the SOC 200 is operating in the normal mode. If the SOC 200 is operating in the deepstop mode, the floating protection circuit may retain the low level data transferred thereto.

The deepstop control logic circuit 206 may generate a core reset signal CORE_nReset in response to the control signals STOP_ON and DeepSTOP_EN. The core reset signal CORE_nReset may determine a reset state of the hard-macro block 204. If the SOC 200 turns to the normal mode from the deep stop mode, the hard-macro block 204 may be instantly reset by the core reset signal CORE_nReset. If the SOC 200 is operating in the deepstop mode, the hard-macro block 204 may not be reset.

If the SOC 200 switches to the deepstop mode from the normal mode the deepstop control logic circuit 206 may turn the hard-macro block 204 off in response to the core enabling signal nCORE_EN and put the hard-macro block 204 into a sleep mode.

If the SOC 200 switches to the deep stop mode from the normal mode, the deepstop control logic circuit 206 may convert data DATA, which is input through the MTCMOS logic circuit 205 for transmission to the hard-macro block 204, to a low level and/or retain the low level data. The data DATA, which is accepted through the MTCMOS logic circuit 205, is converted into the low level data because it may be advantageous to retain data, which is input to a core (CPU), on a low level because there may be a leakage current due to a higher level signal applied to the hard-macro block 204 if the hard-macro block 204 employs a electrostatic diode.

Accordingly, because the hard-macro block 204 may be powered off if the SOC 200 is operating in the deepstop mode, a leakage current may be reduced in the hard-macro block 204. With a smaller leakage current in the hard-macro block 204, the total leakage current of the SOC 200 may be reduced.

If the SOC 200 switches to the normal mode from the stop mode or the deepstop mode, the MTCMOS logic circuit 205 may operate in the normal mode in response to the control signals nSC and MTC generated from the MTCMOS control logic circuit 202. The MTCMOS logic circuit 205 may transfer input data to each block in the normal mode. Accordingly, if the SOC 200 switches to the normal mode from the stop mode or the deepstop mode, the MTCMOS logic circuit 205 may output the data and/or transfer the output data to the blocks. If the SOC 200 switches to the normal mode from the deepstop mode, data sent to the hard-macro block 204 may be transferred to the hard-macro block 204 by way of the deepstop control logic circuit 206.

The deepstop control logic circuit 206 may receive a reset signal nReset from the MTCMOS logic circuit 205 and/or generate a deepstop reset signal DeepSTOP_nRest (e.g., refer to FIG. 5) in response to the control signals nSC and MTC provided from the MTCMOS control logic circuit 202. The deepstop control logic circuit 206 may generate the core reset signal CORE_nReset in response to the reset signal nReset and the deepstop reset signal DeepSTOP_nReset, and/or transfer the core reset signal CORE_nReset to the hard-macro block 204. The core reset signal CORE_nReset may be activated or inactivated by the reset signal nReset and/or the deepstop reset signal DeepSTOP_nReset.

If the SOC 200 switches to the deep stop mode from the normal mode, the core reset signal CORE_nReset may be activated and maintain an active state. If the SOC 200 switches to the normal mode from the deepstop mode, the core reset signal CORE_nReset, which is activated, may be reset and maintain an inactive state.

If the SOC 200 switches to the normal mode from the deepstop mode, the deepstop control logic circuit 206 may place the hard-macro block 204 into the normal mode in response to the core enabling signal nCORE_EN and/or transfer data DATA, which is input from the MTCMOS logic circuit 205, to the hard-macro block 204 as core data CORE_DATA.

In the SOC 200, the stop mode may be different from the deepstop mode. A user may select one from the stop and deepstop modes. In the deepstop mode, the SOC 200 may include the deepstop control logic circuit 206. However, in the stop mode, the SOC 200 need not include the deepstop control logic circuit 206. In the stop mode, the SOC 200 may operate to reduce a leakage current through the MTCMOS logic circuit 205, but not through the hard-macro block 204. However, in the deepstop mode, the SOC 200 may operate to reduce leakage currents through the MTCMOS logic circuit 205 and the hard-macro block 204. The deepstop mode may be an operation mode newly established by a user, and/or inherently including the stop mode. Therefore, the stop mode need not be used if the deepstop mode is selected by a user.

If the SOC 200 is operating in the deepstop mode, the stop-on signal STOP_ON, the multi-stop-on signal MT_STOPON, the control signal nSC, and/or the control signal MTC may function as a deepstop-mode condition signal, a delayed deepstop-mode condition signal, a power managing signal, and/or a data control signal, respectively.

Hereinafter a deep stop mode according to example embodiments will be described.

Figure 2:
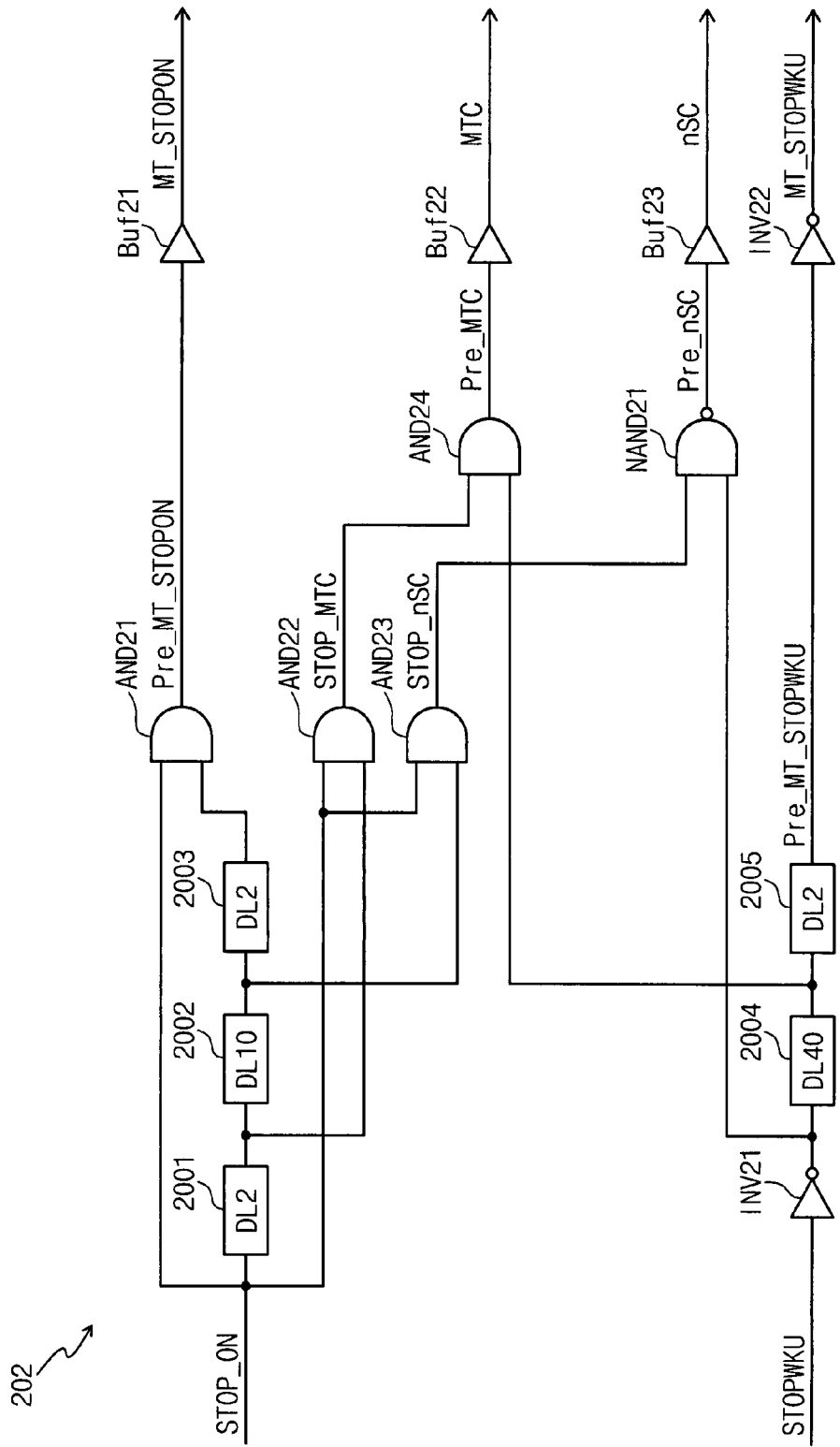
FIG. 2 is a circuit diagram of the MTCMOS control logic circuit shown in FIG. 1.

FIG. 2 is a circuit diagram of the MTCMOS control logic circuit 202 shown in FIG. 1.

Referring to FIG. 2, the MTCMOS control logic circuit 202 may include a plurality of delay circuits 2001~2005, a plurality of AND gates AND21~AND24, a plurality of buffers Buf21~Buf23, a NAND gate NAND21, and/or inverters INV21 and INV22. The delay circuits 2001, 2003, and 2005 may have a same delay time. The delay circuit 2002 may have a longer delay time than the delay circuits 2001, 2003, and 2005. The delay circuit 2004 may have a longer delay time than the delay circuit 2002.

The stop-on signal STOP_ON generated from the power manager 201 may be applied to a first input of the AND gate 21 of the MTCMOS control logic 202 and/or applied to a second input of the AND gate 21 through the delay circuits 2001, 2002, and 2003. The stop-on signal STOP_ON may be applied to first inputs of the AND gates AND22 and AND23, to a second input of the AND gate AND22 through the delay circuit 2001, and to a second input of the AND gate AND23 through the delay circuits 2001 and 2002.

The AND gate AND21 of the MTCMOS control logic circuit 202 may receive the stop-on signal STOP_ON at a first input and/or receives a signal, which is the stop-on signal STOP_ON delayed by the delay circuits 2001, 2002, and 2003, at a second input. The AND gate AND21 may logically combine the stop-on signal and the delayed stop-on signal, and generates a pre-multi-stop-on signal pre_MT_STOPON. The pre-multi-stop-on signal pre_MT_STOPON may be output as the multi-stop-on signal MT_STOPON through the buffer Buf21.

The AND gate AND22 of the MTCMOS control logic circuit 202 may receive the stop-on signal STOP_ON at a first input and/or receive a signal, which the stop-on signal STOP_ON delayed by the delay circuit 2001, at a second input. The AND gate AND22 may logically combine the stop-on signal and the delayed stop-on signal, and generate a stop-MTC signal STOP_MTC. The stop-MTC signal STOP_MTC may be applied to a first input of the AND gate AND24.

The AND gate AND23 of the MTCMOS control logic circuit 202 may receive the stop-on signal STOP_ON at a first input and/or receive a signal, which is the stop-on signal STOP_ON delayed by the delay circuits 2001 and 2002, at a second input. The AND gate AND23 may logically combines the stop-on signal and the delayed stop-on signal, and generate a stop-nSC signal STOP_nSC. The stop-nSC signal STOP_nSC may be applied to a first input of the NAND gate NAND21.

The wakeup signal STOPWKU may be applied to a second input of the NAND gate NAND21 through the inverter INV21 and/or applied to a second input of the AND gate AND24 through the inverter INV21 and the delay circuit 2004. The wakeup signal STOPWKU may be output as a pre-multi-wakeup signal Pre_MT_STOPWKU applied through the inverter INV21 and delayed through the delay circuits 2004 and 2005. The delayed pre-multi-wakeup signal Pre_MT_STOPWKU may be output as the multi-wakeup signal MT_STOPWKU through the inverter INV22.

The AND gate AND24 of the MTCMOS control logic circuit 202 may receive the stop-MTC signal STOP_MTC at a first input and/or receive a signal, which is the wakeup signal STOPWKU delayed through the delay circuit 2004 and inverted by the inverter INV21, at a second input. The AND gate 24 may generate a pre-MTC signal Pre_MTC from logically combining the stop-MTC signal STOP_MTC and the inverted, delayed wakeup signal STOPWKU. The pre-MTC signal Pre_MTC may be output as the control signal MTC for controlling the MTCMOS logic circuit 205 by way of the buffer Buf22.

The NAND gate NAND21 of the MTCMOS control logic circuit 202 may receive the stop-nSC signal STOP_nSC at a first input and/or receive the wakeup signal STOPWKU through the inverter INV21 at a second input. The NAND gate 21 may generate a pre-nSC signal Pre_nSC from logically combining the stop-nSC signal STOP_nSC and the inverted wakeup signal STOPWKU. The pre-nSC signal Pre_nSC may be output as the control signal nSC for controlling the MTCMOS logic circuit 205 by way of the buffer Buf23.

Figure 3:
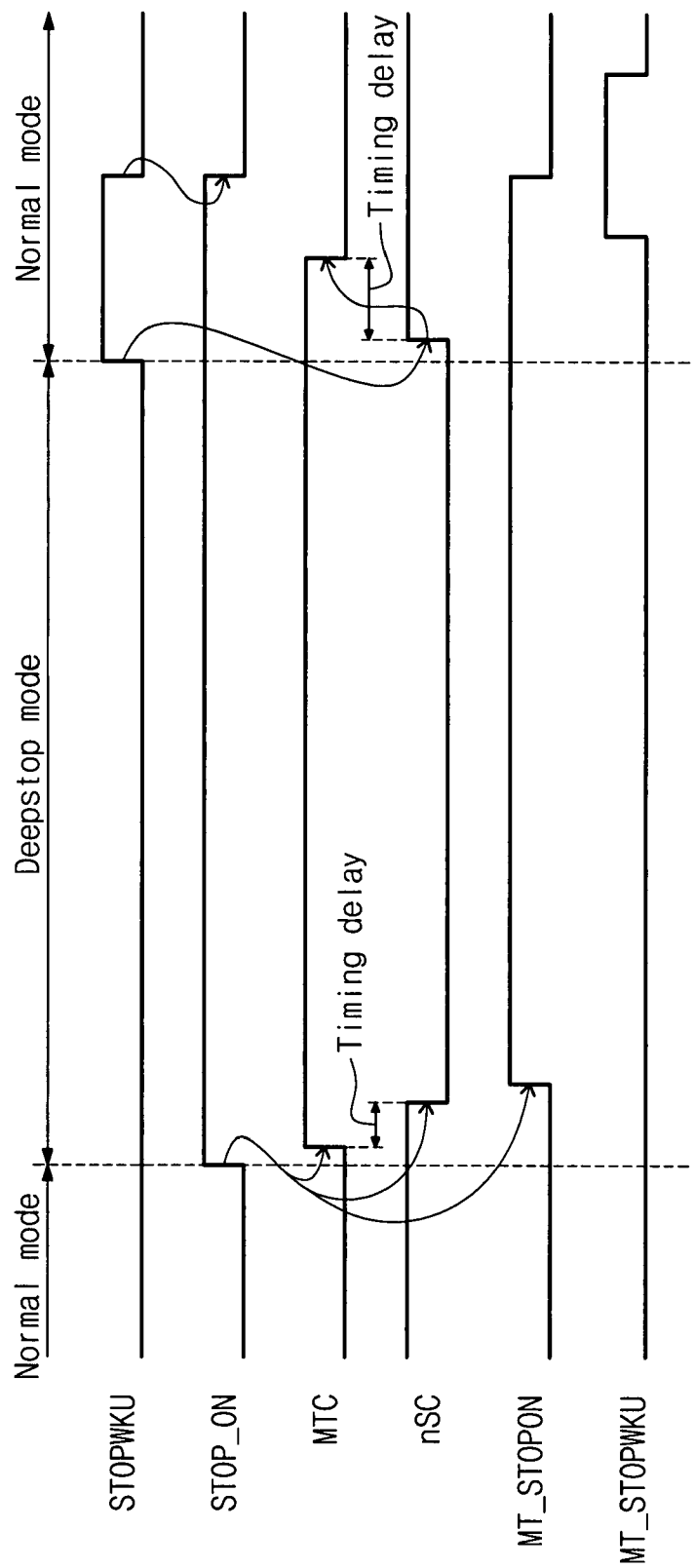
FIG. 3 is an example input/output timing diagram of the MTCMOS control logic circuit shown in FIG. 1.

FIG. 3 is an example input/output timing diagram of the MTCMOS control logic circuit 202 shown in FIG. 1.

Referring to FIGS. 2 and 3, in an operation of the MTCMOS logic circuit according to an example embodiment, the stop-on signal STOP_ON may become a high level and the wakeup signal STOPWKU may be a low level if the SOC 200 switches to the deep stop mode from the normal mode. The MTCMOS control logic circuit 202 may receive the stop-on signal STOP_ON generated from the power manager 201 and the wakeup signal STOPWKU from the real time clock circuit 203. The MTCMOS control logic circuit 202 may generate the control signals nSC and MTC for controlling the MTCMOS logic circuit 205, the multi-stop-on signal MT_STOPON delayed from the stop-on signal STOP_ON, and/or the multi-wakeup signal MT_STOPWKU delayed from the wakeup signal STOPWKU, in response to the signals STOP_ON and STOPWKU.

The control signal MTC generated from the MTCMOS control logic circuit 202 may switch to a high level and the control signal nSC may switch to a low level. The multi-stop-on signal MT_STOPON may switch to a high level. As the SOC 200 is conditioned in the deepstop mode, the wakeup signal STOPWKU and the multi-wakeup signal MT_STOPWKU may maintain low levels.

The control signals nSC and MTC, the multi-stop-on signal MT_STOPON, and the wakeup signal MT_STOPWKU, generated from the MTCMOS control logic circuit 202, may be output having delay times different from each other in correspondence with an operation mode of the SOC 200.

As illustrated in FIG. 3, a low level of the control signal nSC may be generated later than a high level of the control signal MTC, and/or a high level of the multi-stop-on signal MT_STOPON may be generated later than a low level of the control signal nSC.

If the SOC 200 switches to the normal mode from the deepstop mode, as shown in FIG. 3, the wakeup signal STOPWKU may maintain a high level for a desired, or alternatively, a predetermined period. The MTCMOS control logic circuit 202 may receive the stop-on signal STOP_ON generated from the power manager 201 and the wakeup signal STOPWKU from the real time clock circuit 203. The MTCMOS control logic circuit 202 may generate the control signals nSC and MTC for controlling the MTCMOS logic circuit 205, the multi-stop-on signal MT_STOPON delayed from the stop-on signal STOP_ON, and the multi-wakeup signal MT_STOPWKU delayed from the wakeup signal STOPWKU, in response to the signals STOP_ON and STOPWKU.

The control signal MTC generated from the MTCMOS control logic circuit 202 may switch to a low level and the control signal nSC may switch to a high level. The multi-wakeup signal MT_STOPWKU may maintain high level for a desired, or alternatively a predetermined period which may be a same length as the desired, or alternatively, the predetermined period of time the wakeup signal STOPWKU maintains a high level. If the wakeup signal STOPWKU returns to low level after a desired, or alternatively, a predetermined period, the multi-wakeup signal MT_STOPWKU may switch to a low level and the stop-on signal STOP_ON and the multi-stop-on signal MT_STOPON may switch to a low level together. If the SOC is operating in the normal mode, the wakeup signal STOPWKU, the multi-wakeup signal MT_STOPWKU, the stop-on signal STOP_ON, and/or the multi-stop-on signal MT_STOPON may maintain low levels.

The control signals nSC and MTC, the multi-stop-on signal MT_STOPON, and/or the wakeup signal MT_STOPWKU, generated from the MTCMOS control logic circuit 202, may be output having delay times different from each other in correspondence with an operation mode of the SOC 200.

As illustrated in FIG. 3, a low level of the control signal MTC may be generated later than a high level of the control signal nSC, and/or a high level of the multi-wakeup-on signal MT_STOPWKU, which is maintained for a desired, or alternatively, a predetermined period, may be generated later than a low level of the control signal MTC.

The control signals nSC and MTC generated from the MTCMOS control logic circuit 202 may be output to the MTCMOS logic circuit 205 and/or the deepstop control logic circuit 206. The multi-stop-on signal MT_STOPON may be output to the real time clock circuit 203 and the multi-wakeup signal MT_STOPWKU may be output to the power manager 201.

Figure 4:
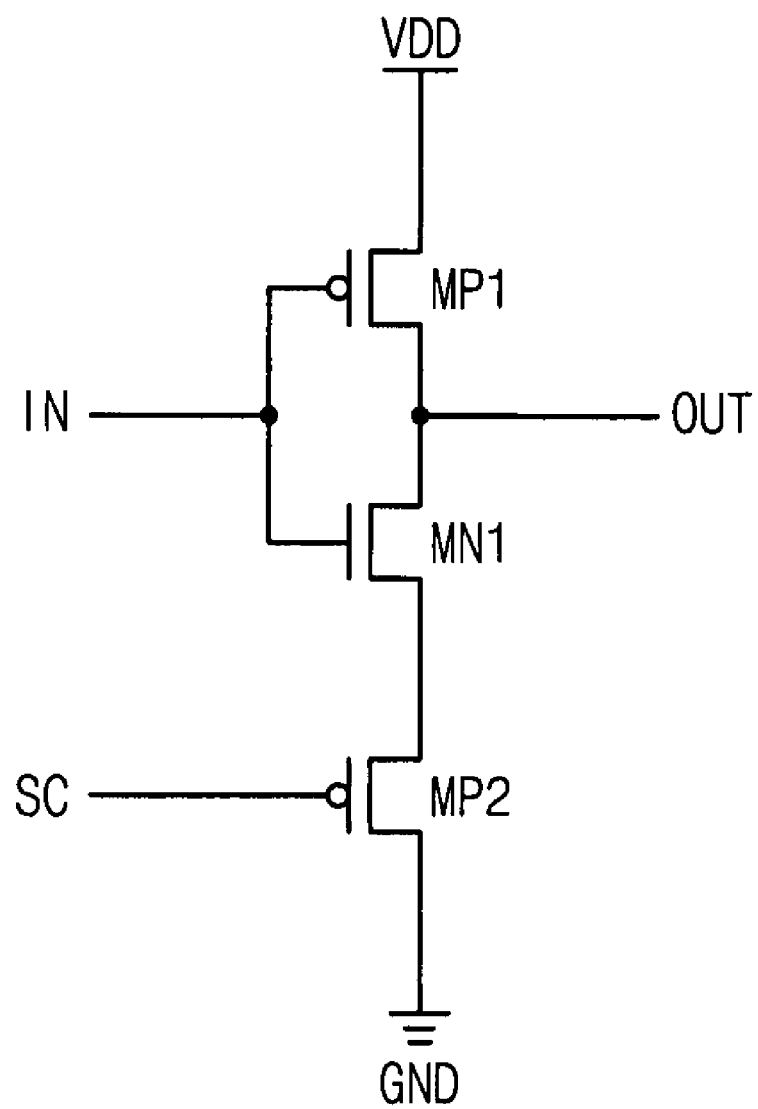
FIG. 4 is a circuit diagram illustrating a cell of the MTCMOS logic circuit shown in FIG. 1.

FIG. 4 is a circuit diagram illustrating a cell of the MTCMOS logic circuit 205 shown in FIG. 1.

Referring to FIG. 4, the cell of the MTCMOS logic circuit 205 may include PMOS transistors MP1 and MP2, and/or an NMOS transistor MN1. A source of the PMOS transistor MP1 may be connected to a power source voltage VDD. A gate of the PMOS transistor MP1 may be connected to an input node IN. A drain of the PMOS transistor MP1 may be connected to an output node OUT. A drain of the NMOS transistor MN1 may be connected to the output node OUT. A gate of the NMOS transistor MN1 may be connected to the input node IN. A source of the NMOS transistor MN1 may be connected to a source of the PMOS transistor MP2. A gate of the PMOS transistor MP2 may be coupled to a control signal SC that is the control signal nSC inverted. A drain of the PMOS transistor MP2 may be connected to the ground GND.

If a MOSFET (i.e., MOS transistor) is turned off, a leakage current flowing toward a substrate (e.g., a body or well) may be generated. A leakage current in the off-state of the MOS transistor may be exponentially dependent on a threshold voltage. For example, the leakage current may increase as a length of a channel (e.g., a channel defined between a source and a drain) is shorter, but may decrease as a channel length is longer. The channel formed in the MOS transistor may be proportional to the threshold voltage of the MOS transistor. The threshold voltage of the MOS transistor may be proportional to a gate width. Accordingly, a smaller gate size of the MOS transistor may cause a lower threshold voltage in the MOS transistor, and/or shorten a channel length of the MOS transistor. Therefore, if the MOS transistor is turned on, a leakage current toward the substrate may increase due to the shorter channel length. However, a larger gate size of the MOS transistor may cause a higher threshold voltage in the MOS transistor, and/or lengthen a channel length of the MOS transistor. Therefore, if the MOS transistor is turned off, a leakage current toward the substrate may decrease due to the longer channel length.

For the normal mode of the SOC 200, the transistors MP1 and MN1 may have lower threshold voltages in order to increase operation speed of the MTCMOS logic circuit 205 functioning as a flipflop. However, if the SOC 200 is operating in the stop mode, a leakage current of the MTCMOS logic circuit 205 may increase because of the lower threshold voltages of the transistors MP1 and MN1. Accordingly, each cell of the MTCMOS logic circuit 205 may include the PMOS transistor MP2 with a higher threshold voltage. If the SOC 200 is operating in the stop mode, the PMOS transistor MP2 of the MTCMOS logic circuit 205 may be turned off by the control signal nSC, reducing a leakage current because of the higher threshold voltage of the PMOS transistor MP2.

Therefore, because of the MTCMOS logic circuit 205 with multi-threshold voltages, the MTCMOS logic circuit 205 may be able to reduce a leakage current therein by turning off the PMOS transistor MP2 having a higher threshold voltage if the SOC 200 is operating in the stop mode.

In each cell of the MTCMOS logic circuit 205, an NMOS transistor may be used instead of the PMOS transistor MP2. In this case, a gate of the NMOS transistor may be coupled to the control signal nSC.

Figure 5:
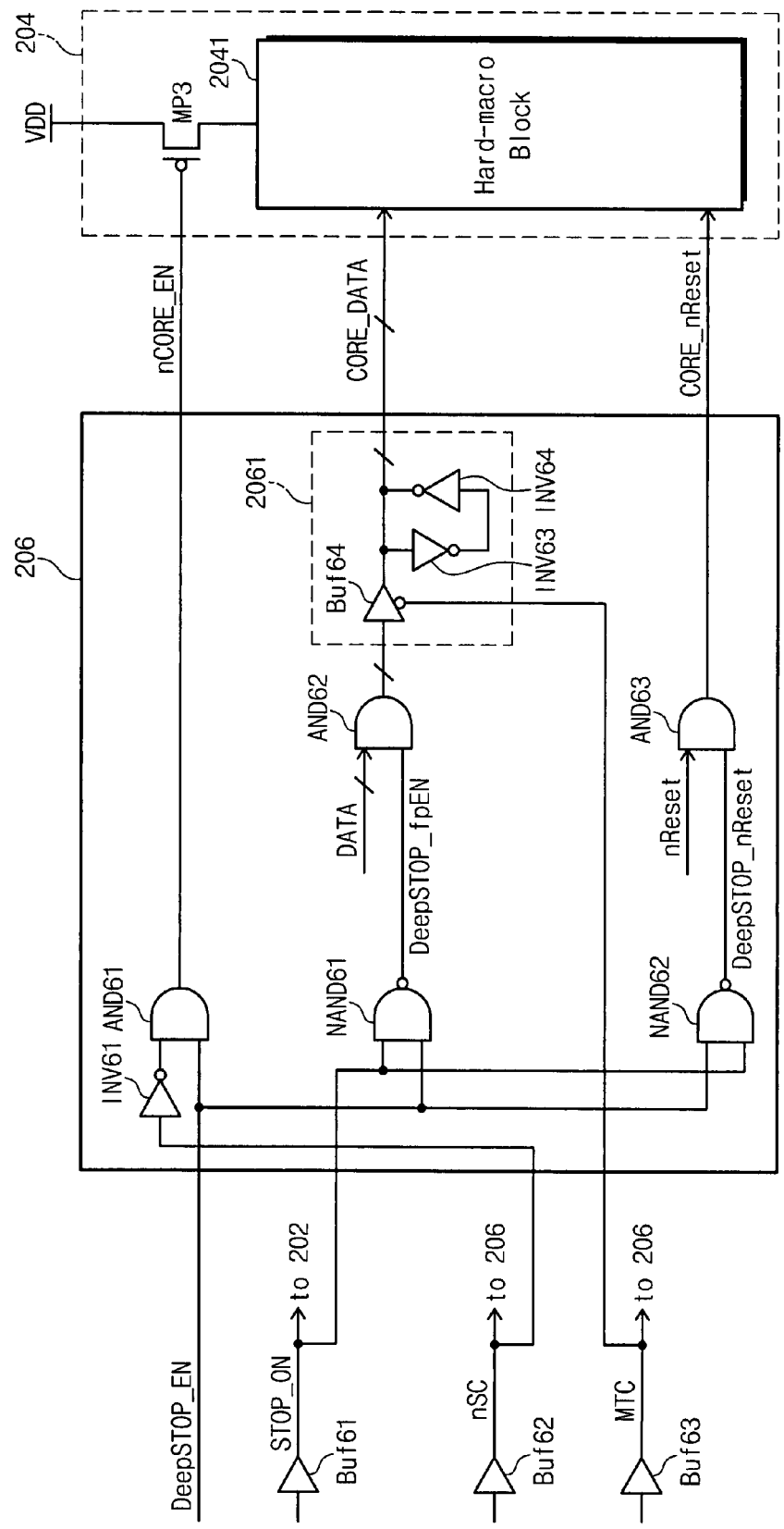
FIG. 5 is a circuit diagram illustrating an interconnection feature between the deepstop control logic circuit and the hard-macro block shown in FIG. 1.

FIG. 5 is a circuit diagram illustrating an interconnection feature between the deepstop control logic circuit 206 and the hard-macro block 204 shown in FIG. 1.

Referring to FIG. 5, the deepstop control logic circuit 206 according to an example embodiment may include AND gates AND61, AND62, AND63, NAND gates NAND61 and NAND62, an inverter INV61, and/or a floating protection circuit 2061. The floating protection circuit 2061 may include a buffer Buf64 operated by the control signal MTC from the MTCMOS control logic circuit 202, and/or inverters INV63 and INV64 for holding data.

The hard-macro block 204 shown in FIG. 1 may include a PMOS transistor for controlling power supply. Therefore, as shown in FIG. 5, the hard-macro block 204 is illustrated as including a PMOS transistor MP3 switching the power source voltage VDD in substance and a hard-macro circuit 2041 turned on or off by the PMOS transistor MP3. A source of the PMOS transistor MP3 may be connected to the power source voltage VDD. A gate of the PMOS transistor MP3 may be coupled to the core enabling signal nCORE_EN. A drain of the PMOS transistor MP3 may be connected to the hard-macro block 2041.

Figure 6:
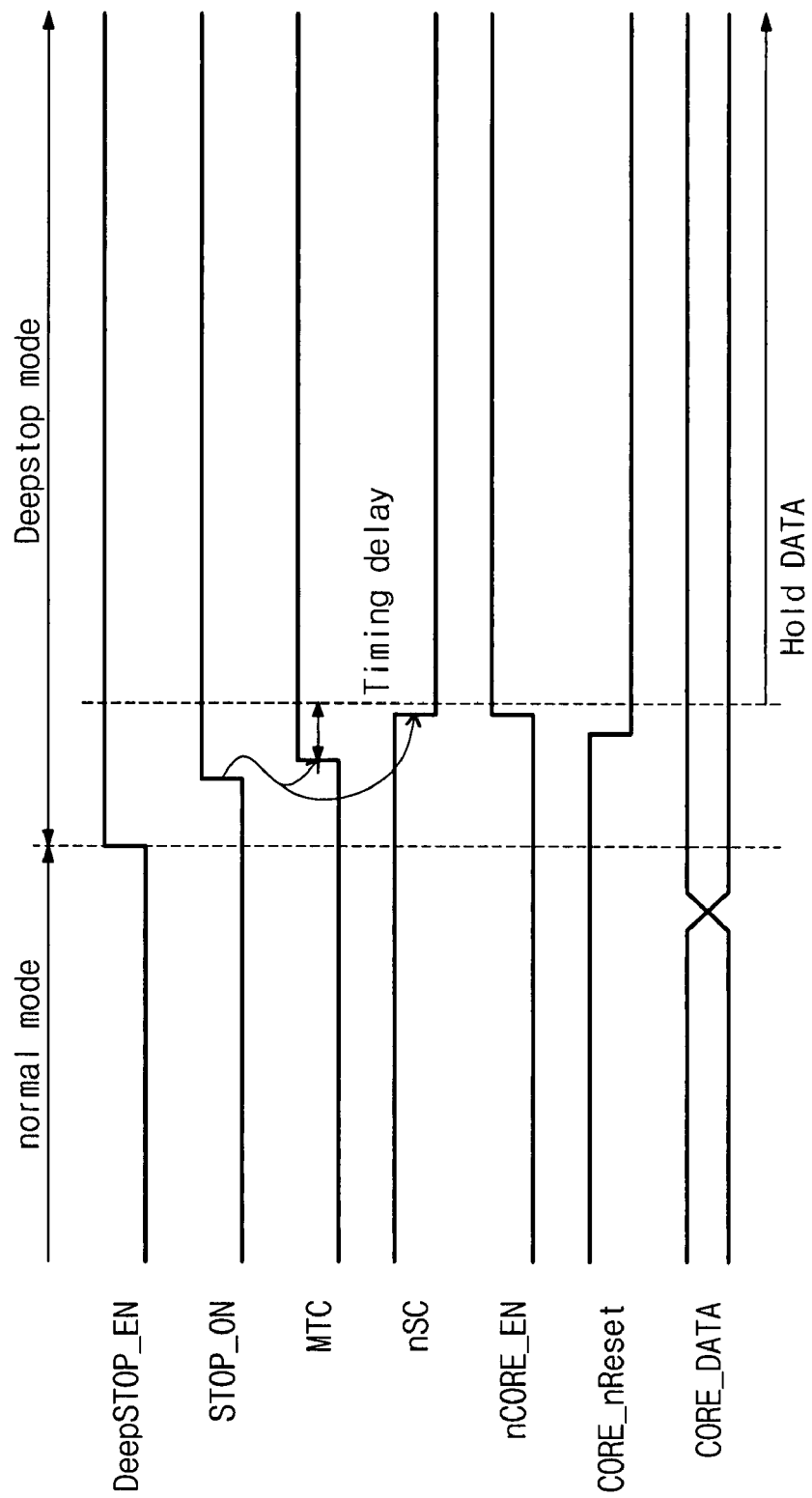
FIG. 6 is an example input/output timing diagram of the deepstop control logic circuit shown in FIG. 1.

FIG. 6 is an example input/output timing diagram of the deepstop control logic circuit shown in FIG. 1.

Referring to FIGS. 5 and 6, an operation of the deepstop control logic circuit 206 according to an example embodiment is detailed below.

If the SOC 200 is operating in the deepstop mode, the deepstop control logic circuit 206 may receive the deepstop enabling signal DeepSTOP_EN and the stop-on signal STOP_ON from the power manager 201, and/or the control signals nSC and MTC from the MTCMOS control logic circuit 202. The signals DeepSTOP_EN, STOP_ON, nSC, and MTC may be input to the deepstop control logic circuit 206 having delay times different from each other. As shown in FIG. 6, the deepstop control logic circuit 206 may input the deepstop enabling signal DeepSTOP_EN first, input the control signal MTC second, and/or input the control signal nSC third.

The deepstop control logic circuit 206 may receive data DATA to be transferred into the hard-macro block 204, and/or the reset signal nReset for resetting the hard-macro block 204 if the SOC 200 is operating in the normal mode.

The deepstop enabling signal DeepSTOP_EN may be applied to a second input of the AND gate AND61, a second input of the NAND gate NAND61, and/or a first input of NAND gate NAND62.

The stop-on signal STOP_ON input through buffer Buf61 may be applied to a first input of the NAND gate NAND61 of the deepstop control logic circuit 206, and/or the second input of the NAND gate NAND62 of the deepstop control logic circuit 206.

The control signal nSC input through the buffer Buf62 may be applied to a first input of the AND gate AND61 through the inverter 61 of the deepstop control logic circuit 206.

The control signal MTC input through the buffer Buf63 may control the buffer Buf64 of the floating protection circuit 2061 of the deepstop control logic circuit 206.

The AND gate AND61 of the deepstop control logic circuit 206 may receive the control signal nSC at the first input through the inverter INV61 and the deepstop enabling signal DeepSTOP_EN at the second input. The AND gate AND61 may generate the core enabling signal nCORE_EN from logically combining the control signal nSC and the deepstop enabling signal DeepSTOP_EN. The core enabling signal nCORE_EN may be applied to the gate of the PMOS transistor MP3 of the hard-macro block 204.

If the SOC 200 switches to the deepstop mode from the normal mode, as illustrated in FIG. 6, the core enabling signal nCORE_EN may switch to high level to turn the PMOS transistor MP3 off. Because the hard-macro block 204 may be powered off to enable the sleep mode, a leakage current in the hard-macro block 204 may be reduced.

If the SOC 200 switches to the normal mode from the deepstop mode, the core enabling signal nCORE_EN may switch to a low level to turn the PMOS transistor MP3 of the hard-macro block 204 on. Accordingly, the hard-macro block 204 may be powered on, thereby enabling the normal mode.

The NAND gate NAND61 of the deepstop control logic circuit 206 may receive the stop-on signal STOP_ON at the first input and the deepstop enabling signal DeepSTOP_EN at the second input. The NAND gate NAND61 may generate the data transmission control signal DeepSTOP_fpEN from logically combining the stop-on signal STOP_ON and the deepstop enabling signal DeepSTOP_EN. The data transmission control signal DeepSTOP_fpEN may be applied to a second input of the AND gate AND62.

A first input (e.g., a plurality of inputs except the second input) of the AND gate AND62 may receive a plurality of data DATA from the MTCMOS logic circuit 205. The AND gate AND62 may receive the plurality of data DATA at the first input (e.g., the plurality of inputs) and the data transmission control signal DeepSTOP_fpEN at the second input. The AND gate AND62 may provide the floating protection circuit 2061 with signals generated from logically combining the plurality of data DATA and the data transmission control signal DeepSTOP_fpEN.

If the SOC 200 switches to the deepstop mode from the normal mode, the deepstop enabling signal DeepSTOP_EN and the stop-on signal STOP_ON may become high levels to make the 2-input NAND gate NAND61 output a low level signal. The AND gate AND62 of the deepstop control logic circuit 206 may change the data DATA, which is input from the MTCMOS logic circuit 205, into low level signals to be output to the floating protection circuit 2061. If the SOC 200 is operating in the deepstop mode, the control signal MTC generated from the MTCMOS control logic circuit 202 may be a high level signal as shown in FIG. 6. Accordingly, the control signal MTC having a high level may be applied to the deepstop control logic circuit 206, turning the buffer Buf64 of the floating protection circuit 2061 off. Because the buffer Buf64 of the floating protection circuit 2061 may be turned off, the data changed to low level signals by the AND gate AND62 may be reserved by the inverters INV63 and INV64.

The data DATA, which are accepted from the MTCMOS logic circuit 205, are changed into low level levels and reserved because a high level signal applied to the hard-macro block 204 may induce a leakage current therein if the hard-macro block 204 employs an electrostatic diode. For example, a leakage current may be reduced by changing the data DATA, which are input to the hard-macro block 204, into low levels and maintaining the low level data. If the hard-macro block 204 does not employ the electrostatic diode, the data DATA from the MTCMOS logic circuit 205 may be reserved in the state just before the deepstop mode by the floating protection circuit 2061 without being changed into low levels by the deepstop control logic circuit 206.

If the SOC 200 switches to the normal mode from the deepstop mode, the MTCMOS control logic circuit 202 may generate the control signal MTC at a low level so that the floating protection circuit 2061 of the deepstop control logic circuit 206 is turned on. Accordingly, if the SOC 200 is operating in the deepstop mode, the deepstop control logic circuit 206 may provide the hard-macro block 204 with data that have been reserved for the normal mode.

If the SOC 200 is operating in the normal mode, the deepstop control logic circuit 206 may output the data DATA, which are input from the MTCMOS logic circuit 205, as core data CORE_DATA by way of the buffer Buf64 of the floating protection circuit 2061. The core data CORE_DATA may be transferred to the hard-macro block 204.

The NAND gate NAND62 of the deepstop control logic circuit 206 may receive the deepstop enabling signal Deep-STOP_EN at a first input and the stop-on signal STOP_ON at a second input. The NAND gate NAND62 may generate the deepstop reset signal DeepSTOP_nReset from logically combining the deepstop enabling signal DeepSTOP_EN and the stop-on signal STOP_ON. The deepstop enabling signal DeepSTOP_EN may be applied to the second input of the 2-input AND gate AND63.

A first input of the AND gate AND63 may receive the reset signal nReset from the MTCMOS logic circuit 205. The AND gate AND63 may receive the reset signal nReset at the first input and the deepstop reset signal DeepSTOP_nReset at the second input. The AND gate AND63 may generate the core reset signal CORE_nReset from logically combining the reset signal nReset and the deepstop reset signal Deep-STOP_EN. The core reset signal CORE_nReset may be output to the hard-macro block 204.

If the SOC is operating in the normal mode, the core reset signal CORE_nReset may switch to high level as shown in FIG. 6. If the SOC 200 switches to the deepstop mode from the normal mode, the core reset signal CORE_nReset may switch to low level as shown in FIG. 6.

Accordingly, if the SOC 200 switches to the normal mode from the deepstop mode, the core reset signal CORE_nReset maintaining a low level may reset the hard-macro block 204 and/or switch to high level. The core reset signal CORE_n-Reset may maintains the high level during the normal mode of the SOC 200.

The AND gate AND62 of the deepstop control logic circuit 206 may be referred to as a first switch and the PMOS transistor MP3 of the hard-macro block 204 may be referred to as a second switch. The AND gate AND61 of the deepstop control logic circuit 206 may be referred to as a first signal generator and the NAND gate NAND61 may be referred to as a second signal generator.

Accordingly, because the SOC 200 may include the deepstop control logic circuit 206 configured to conduct the deepstop mode, the SOC 200 may be able to reduce a leakage current of the MTCMOS logic circuit 205 and the hard-macro block 204 during the deepstop mode, thereby lowering an overall rate of leakage current dissipation.

An SOC including the deepstop control logic circuit configured to conduct the deepstop mode according to example embodiments may reduce the overall leakage current in the SOC during the deepstop mode.

Although example embodiments have been shown and described in this specification and figures, it would be appreciated by those skilled in the art that changes may be made to the illustrated and/or described example embodiments without departing from their principles and spirit.

What is claimed is:

1. A system-on-chip comprising:
   a hard-macro block; and
   a deepstop control logic circuit configured to transfer data to the hard-macro block from a multi-threshold complementary metal-oxide-semiconductor (MTCMOS) logic circuit during a normal mode;
   wherein the deepstop control logic circuit is configured to latch the data output from the MTCMOS logic circuit upon an entry into a deepstop mode and interrupt a power supply to the hard-macro block during the deepstop mode.

2. The system-on-chip as set forth in claim 1, further comprising:
   a power manager configured to activate a deepstop enabling signal, during the deepstop mode, and a deepstop-mode condition signal indicating the entry into the deepstop mode; and
   a multi-threshold complementary metal-oxide-semiconductor (MTCMOS) control logic circuit configured to activate a power managing signal and a data control signal in response to an activation of the deepstop-mode condition signal, wherein
   the deepstop control logic circuit is configured to latch the data output from the MTCMOS logic circuit in response to activations of the deepstop enabling signal, the deepstop-mode condition signal, and the data control signal, and to interrupt the power supply to the hard-macro block in response to activations of the deepstop enabling signal and the power managing signal.

3. The system-on-chip as set forth in claim 2, wherein
the data control signal is activated after the activation of the deepstop-mode condition signal, and
the power managing signal is activated after the activation of the data control signal.

4. The system-on-chip as set forth in claim 2, wherein the deepstop control logic circuit includes,
a first signal generator configured to activate a core enabling signal in response to activations of the deepstop enabling signal and the power managing signal;
a second signal generator configured to activate a data transmission control signal in response to activations of the deepstop-mode condition signal and the deepstop enabling signal;
a first switch configured to selectively output the data from the MTCMOS logic circuit in response to the data transmission control signal; and
a floating protection circuit configured to transfer the data to the hard-macro block from the first switch,
wherein the floating protection circuit is configured to latch the output data of the first switch and to interrupt an electrical connection to the first switch during the activation of the data control signal.

5. The system-on-chip as set forth in claim 4, wherein after interrupting the electrical connection to the first switch, the data latched by the floating protection circuit is conditioned in a logically low state.

6. The system-on-chip as set forth in claim 4, wherein the hard-macro block includes,
a core logic circuit; and
a second switch configured to interrupt the power supply to the core logic circuit in response to an activation of the core enabling signal.

7. The system-on-chip as set forth in claim 4, wherein
the MTCMOS logic circuit is configured to generate a reset signal during the normal mode, and
the deepstop control logic circuit is configured to selectively generate a deepstop reset signal in response to the deepstop enabling signal and the deepstop-mode condition signal, and generate a core reset signal in response to the reset signal and the deepstop reset signal.

8. The system-on-chip as set forth in claim 2, wherein the MTCMOS control logic circuit is configured to generate a delayed deepstop-mode condition signal in response to an activation of the deepstop-mode condition signal.

9. The system-on-chip as set forth in claim 8, further comprising:
a real time clock circuit configured to operate in response to the delayed deepstop-mode condition signal and generate a wakeup signal in accordance with an entry into the normal mode.

10. The system-on-chip as set forth in claim 9, wherein
if the wakeup signal is activated,
the MTCMOS control logic circuit is configured to inactivate the power managing signal and the data control signal, generate a delayed wakeup signal, and output the delayed wakeup signal to the power manager,
and the power manager is configured to inactivate the deepstop enabling signal and the deepstop-mode condition signal in response to the delayed wakeup signal.

11. The system-on-chip as set forth in claim 10, wherein the first signal generator is configured to inactivate the core enabling signal if the power managing signal and the deepstop enabling signal are inactivated so that that the power supply to the hard-macro block is resumed.

12. The system-on-chip as set forth in claim 10, wherein
the second signal generator is configured to inactivate a data transmission control signal in response to inactivations of the deepstop-mode condition signal and the deepstop enabling signal, and
the first switch is configured to transfer the data to the floating protection circuit from the MTCMOS logic circuit during inactivation of the data transmission control signal.

13. The system-on-chip as set forth in claim 10, wherein the floating protection circuit is electrically connected to the first switch if the data control signal is inactivated.

14. A method for controlling power of a system-on-chip, comprising:
latching data transferred to a hard-macro block from a multi-threshold complementary metal-oxide-semiconductor (MTCMOS) logic circuit during a deepstop mode;
interrupting a power supply to the hard-macro block after latching the data;
resuming the power supply to the hard-macro block if the deepstop mode switches to a normal mode; and
resuming data transmission to the hard-macro block from the MTCMOS logic circuit.

15. The method as set forth in claim 14, further comprising:
interrupting an electrical connection between the hard-macro block and the MTCMOS circuit while latching the data transferred to the hard-macro block from the MTCMOS logic circuit.

* * * * *